(12) United States Patent
Taniguchi et al.

(10) Patent No.: US 8,030,224 B2
(45) Date of Patent: Oct. 4, 2011

(54) MANUFACTURING METHOD OF SEMICONDUCTOR DEVICE, SEMICONDUCTOR DEVICE, COMMUNICATION APPARATUS, AND SEMICONDUCTOR LASER

(75) Inventors: Hidehiro Taniguchi, Tokyo (JP); Takeshi Namegaya, Tokyo (JP); Etsuji Katayama, Tokyo (JP)

(73) Assignee: Furukawa Electric Co., Ltd., Tokyo (JP)

( * ) Notice: Subject to any disclaimer, the term of this patent is extended or adjusted under 35 U.S.C. 154(b) by 0 days.

(21) Appl. No.: 12/785,240

(22) Filed: May 21, 2010

(65) Prior Publication Data

US 2010/0232464 A1  Sep. 16, 2010

Related U.S. Application Data

(63) Continuation of application No. PCT/JP2008/071151, filed on Nov. 20, 2008.

(30) Foreign Application Priority Data

Nov. 21, 2007 (JP) .................................. 2007-301591

(51) Int. Cl.
    *H01L 21/00* (2006.01)
(52) U.S. Cl. .......... 438/795; 438/31; 438/792; 438/149; 438/500; 257/E21.302; 257/E33.067; 257/501; 257/502
(58) Field of Classification Search ............ 438/795, 438/500, 139, 792, 149; 257/502, 501, E21.302
See application file for complete search history.

(56) References Cited

U.S. PATENT DOCUMENTS

| | | | |
|---|---|---|---|
| 6,154,475 A * | 11/2000 | Soref et al. .............. | 372/45.011 |
| 2006/0214257 A1* | 9/2006 | Ninomiya et al. ............ | 257/502 |
| 2007/0004102 A1* | 1/2007 | Dairiki et al. ................ | 438/149 |
| 2007/0026620 A1 | 2/2007 | Yamada | |
| 2009/0141763 A1* | 6/2009 | Kishino et al. ............. | 372/45.01 |
| 2010/0054810 A1* | 3/2010 | Fuchigami .................... | 399/159 |

FOREIGN PATENT DOCUMENTS

| | | |
|---|---|---|
| CN | 1922771 A | 2/2007 |
| JP | 7-122816 | 5/1995 |
| JP | 2004-342733 | 12/2004 |
| JP | 2007-150170 | 6/2007 |
| JP | 2007-242718 | 9/2007 |
| WO | WO 2005/057744 | 6/2005 |

OTHER PUBLICATIONS

International Preliminary Report on Patentability in International Application No. PCT/JP2008/071151, filed on Nov. 20, 2008 (English Translation Only).

Office Action issued May 25, 2011, in Chinese Patent Application No. 200880117257.8.

* cited by examiner

*Primary Examiner* — Matthew Smith
*Assistant Examiner* — Wilner Jean Baptiste
(74) *Attorney, Agent, or Firm* — Oblon, Spivak, McClelland, Maier & Neustadt, L.L.P.

(57) ABSTRACT

A method of manufacturing a semiconductor device including a semiconductor layer and a dielectric layer deposited on the semiconductor layer, including: forming the semiconductor layer; performing a surface treatment for removing a residual carbon compound, on a surface of the semiconductor layer formed; forming a dielectric film under a depositing condition corresponding to a surface state after the surface treatment, on at least a part of the surface of the semiconductor layer on which the surface treatment has been performed; and changing a crystalline state of at least a partial region of the semiconductor layer by performing a heat treatment on the semiconductor layer on which the dielectric film has been formed.

14 Claims, 9 Drawing Sheets

MANUFACTURING METHOD OF SEMICONDUCTOR DEVICE, SEMICONDUCTOR DEVICE, COMMUNICATION APPARATUS, AND SEMICONDUCTOR LASER

CROSS-REFERENCE TO RELATED APPLICATIONS

This application is a continuation of PCT International Application No. PCT/JP2008/071151 filed on Nov. 20, 2008 which claims the benefit of priority from Japanese Patent Application No. 2007-301591 filed on Nov. 21, 2007, the entire contents of which are incorporated herein by reference.

BACKGROUND OF THE INVENTION

1. Field of the Invention

The present invention relates to a manufacturing method of a semiconductor device, a semiconductor device, a communication apparatus, and a semiconductor laser. More particularly, the invention relates to a manufacturing method of a semiconductor device that includes a semiconductor laminated structure in its structure, a semiconductor device, a communication apparatus, and a semiconductor laser.

2. Description of the Related Art

Semiconductor optical devices include optical devices that perform electricity-light conversion/light-electricity conversion, such as light emitting devices and light receiving devices, and optical devices that transmit optical signals, such as optical waveguides, optical switches, isolators, and photonic crystals.

The light emitting devices such as semiconductor lasers and light-emitting diodes, of the optical devices that perform the electricity-light conversion/light-electricity conversion, each include a semiconductor laminated structure constituted of a plurality of semiconductor layers including an active layer of a semiconductor hetero structure or a quantum well structure. These light emitting devices utilize the action of radiation recombination in the semiconductor laminated structure to perform the electricity-light conversion.

The light receiving devices each similarly include a semiconductor laminated structure constituted of a plurality of semiconductor layers. The light receiving devices each utilize the action of light absorption in a certain semiconductor layer in the semiconductor laminated structure to perform the light-electricity conversion.

The optical devices that perform the transmission of the optical signals each include, depending on their types, a semiconductor laminated structure constituted of a plurality of semiconductor layers having predetermined refractive indices (or a plurality of semiconductor layers that include a semiconductor layer having a variable refractive index by an electrooptic effect). The optical devices that perform the transmission of the optical signals each perform desired optical-signal transmission utilizing a difference between refractive indices of the plurality of semiconductor layers.

While the optical devices described above are mainly constituted of the semiconductor laminated structures, their manufacturing methods sometimes include a process for changing a physical property of a predetermined semiconductor layer in the semiconductor laminated structure.

For example, when the optical device is a semiconductor laser, a window region may be formed on an emission facet for getting laser light generated by resonating light generated by radiation recombination to the outside. The emission facet of the semiconductor laser may be degraded by high-density light absorption, and this may cause catastrophic optical damage (COD). Therefore, in the semiconductor laser formed with the window region, absorption of emitted light at the position of the emission facet is reduced by increasing the bandgap of the semiconductor of the semiconductor laminated structure at that position.

To form such a window region, for example, in a GaAs semiconductor laser, a dielectric film having an effect of promoting diffusion of Ga of a semiconductor laminated structure corresponding to the window region is formed on laminated layers of the semiconductor laminated structure, as described in Japanese Patent Application Laid-open No. H7-122816. The semiconductor laminated structure is then heat-treated, thereby disordering a predetermined semiconductor layer in the semiconductor laminated structure corresponding to the window region, and changing a physical property value of the semiconductor layer. That is, a process of increasing a bandgap is performed. This method is called an impurity free vacancy disordering (IFVD) method.

DISCLOSURE OF INVENTION

Problem to be Solved by the Invention

When an optical device that includes a semiconductor laminated structure in its structure is manufactured, if heat treatment is performed after forming a dielectric film on laminated layers in the semiconductor laminated structure, cracks may be generated in the heat treatment of the dielectric film formed on a surface of the laminated layers in the semiconductor laminated structure, and effects of the dielectric film may be reduced. As a result, a semiconductor surface at which the dielectric film has been formed is roughened, and if an electrode is formed on the semiconductor surface after that, there is a problem of a contact resistance being increased. Particularly, the IFVD method, to which the present invention is directed, requires a heat treatment at a temperature higher than a temperature generally used in heat treatments, to disorder a window region and achieve a bandgap of a desirable magnitude. When a device is manufactured by a conventionally used common process, the heat treatment generates cracks in the dielectric layer, and functions of the dielectric layer are prominently damaged. As a result, there has been a problem of not being able to generate a bandgap of a desirable magnitude, or the contact resistance increasing due to a roughened semiconductor-layer surface following the generation of cracks in the dielectric layer.

SUMMARY OF THE INVENTION

A method according to an aspect of the present invention for manufacturing a semiconductor device including a semiconductor layer and a dielectric layer deposited on the semiconductor layer includes: forming the semiconductor layer; performing a surface treatment for removing a residual carbon compound, on a surface of the semiconductor layer formed; forming a dielectric film under a depositing condition corresponding to a surface state after the surface treatment, on at least a part of the surface of the semiconductor layer on which the surface treatment has been performed; and changing a crystalline state of at least a partial region of the semiconductor layer by performing a heat treatment on the semiconductor layer on which the dielectric film has been formed.

A semiconductor device according to another aspect of the present invention is manufactured by the method.

A communication apparatus according to yet another aspect of the present invention uses the semiconductor device.

The above and other features, advantages, and technical and industrial significance of this invention will be better understood by reading the following detailed description of presently preferred embodiments of the invention, when considered in connection with the accompanying drawings.

DETAILED DESCRIPTION OF THE PREFERRED EMBODIMENTS

Figure 1A:
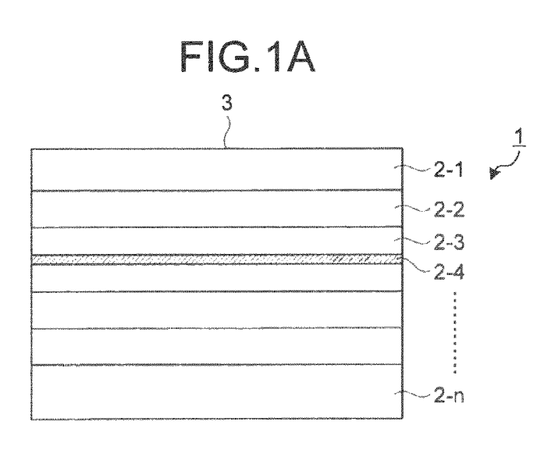
FIG. 1 is cross-sectional views of, in the order of manufacturing steps, a semiconductor laminated structure to constitute an optical device manufactured by a manufacturing method of an optical device according to an embodiment of the present invention.
Figure 1B:
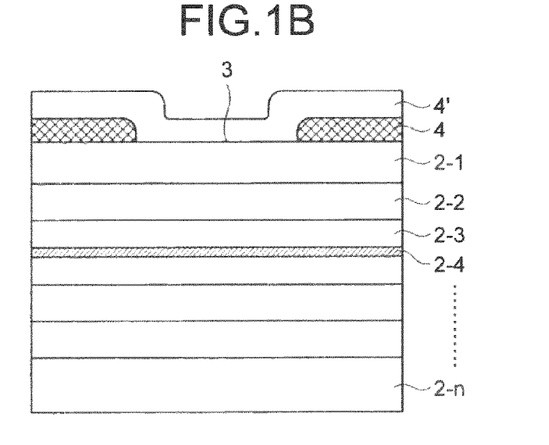
Figure 1C:
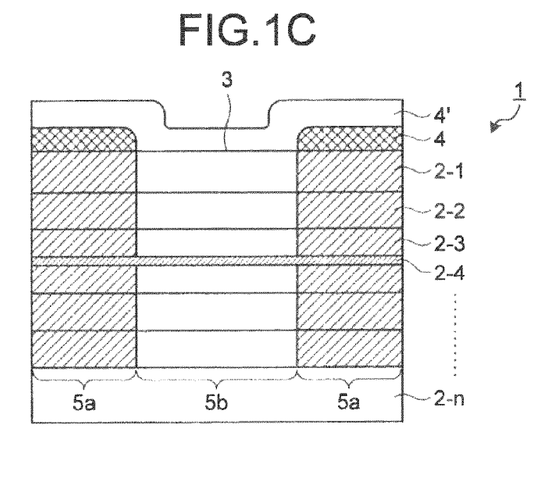

The present invention is based on a discovery that by rendering a surface state of a semiconductor layer and a refractive index of a dielectric layer deposited on the semiconductor layer to have a certain relation with each other, roughening of a semiconductor layer surface by a subsequent heat treatment process can be prevented. A manufacturing method of an optical device according to an embodiment of the present invention will be explained below with reference to the drawings. FIG. 1(a) depicts a cross section of a semiconductor laminated structure 1 for constituting an optical device not illustrated and manufactured by the manufacturing method of an optical device according to the embodiment of the present invention. The semiconductor laminated structure 1 is constituted of a plurality of semiconductor layers 2-1 and 2-2 to 2-n. Semiconductor materials of the plurality (n layers) of semiconductor layers 2-1 and 2-2 to 2-n are of a plurality of types.

The manufacturing method of an optical device according to the embodiment of the present invention includes a step of performing a heat treatment on the semiconductor laminated structure 1, and uses a thermal action of the heat treatment, as will be explained below. Therefore, since the semiconductor materials of the semiconductor layers 2-1, and 2-2 to 2-n are of the plurality of types as stated above, each of the semiconductor layers 2-1 and 2-2 to 2-n receives a different thermal action, thereby practically achieving effects of the heat treatment.

Although the semiconductor materials are not particularly limited, a compound semiconductor constituted of a plurality of constituent atoms is preferable. This is because when the semiconductor layers 2-1 and 2-2 to 2-n are formed of compound semiconductors each constituted of a plurality of constituent atoms, bond energies of the constituent atoms of the compound semiconductors differ depending on kinds of the constituent atoms, and thus they are easily affected by the thermal actions in the heat treatment. In other words, because the bond energies of the constituent atoms of a semiconductor that constitutes a semiconductor layer are different depending on the kinds of the constituent atoms, a part of the constituent atoms moves due to the thermal action in the heat treatment, and a crystalline state of the semiconductor at that position becomes easy to change. The constituent atoms are atoms for constituting the semiconductor material itself. Of course, not only compound semiconductors, but a semiconductor material made of a single element may be used as the semiconductor layers 2-1 and 2-2 to 2-n of the semiconductor laminated structure 1, as long as crystalline states of the semiconductor materials change by movement of constituent atoms due to the thermal actions in the heat treatment.

Although the optical device is not depicted in the drawings, it may be any optical device as long as it has the semiconductor laminated structure 1 described above in its stricture. For example, the optical device may be an optical device that performs electricity-light conversion/light-electricity conversion such as a light emitting device or a light receiving device, or an optical device that transmits optical signals such as an optical waveguide, an optical switch, an isolator, or a photonic crystal. The present invention is not limited to optical devices, and may be widely applied to semiconductor devices such as a MOS diode and a MOS transistor that are semiconductor devices each having a dielectric layer formed on a semiconductor layer and that require improvement in adhesiveness thereof.

A process of manufacturing an optical device that includes the semiconductor laminated structure 1 described above in its structure is explained with reference to cross-sectional views for explaining some of the manufacturing process of the optical device, which are depicted in FIGS. 1(*a*) to 1(*c*), a flowchart depicted in FIG. 2, and a schematic diagram depicted in FIG. 3.

Figure 2:
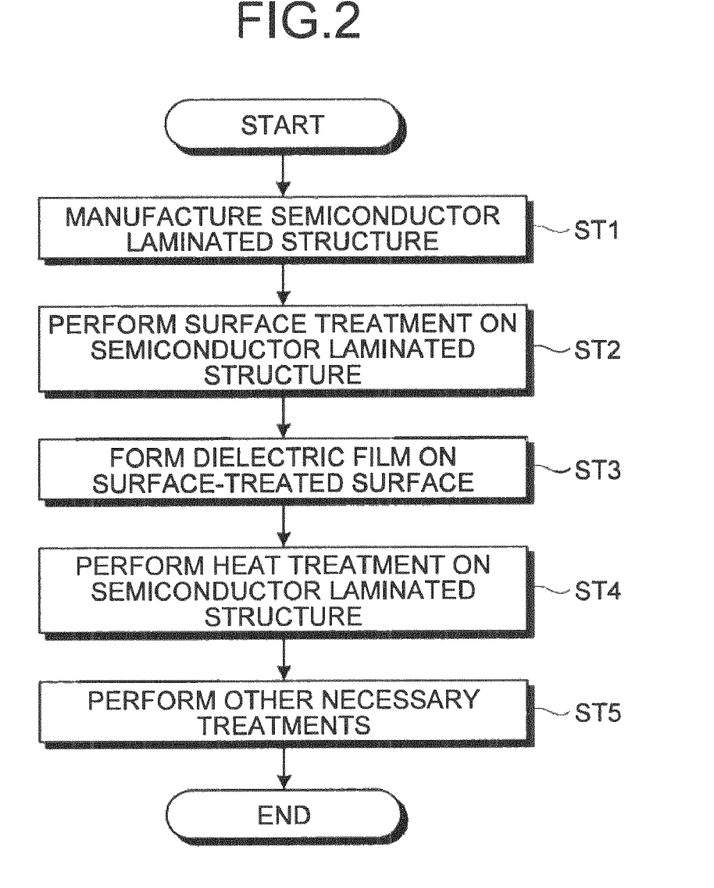
FIG. 2 is a flowchart of a manufacturing process of an optical device manufactured by the manufacturing method of an optical device according to the embodiment of the present invention.

First, the semiconductor laminated structure 1 depicted in FIG. 1(*a*) is prepared (ST1 in FIG. 2). Next, a surface treatment is performed on a laminated layer surface 3 of the semiconductor laminated structure 1 depicted in FIG. 1(*a*) (ST2 in FIG. 2).

Figure 3:
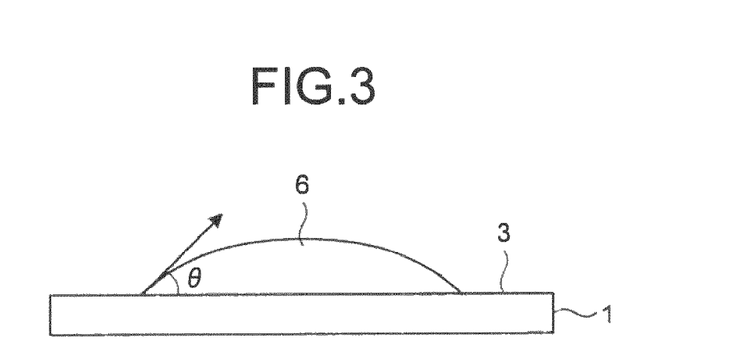
FIG. 3 is a schematic diagram for explaining the manufacturing method of an optical device according to the embodiment of the present invention.

Preferably, a state after performing the surface treatment on the laminated layer surface 3 of the semiconductor laminated structure 1 is such that the laminated layer surface 3 demonstrates a hydrophilic property if it is assumed that water 6 is present on the laminated layer surface 3 of the semiconductor laminated structure 1 on which the surface treatment has been performed, as depicted in FIG. 3. This is because the fact that the laminated layer surface 3 demonstrates that property after the surface treatment according to the present invention indicates that the laminated layer surface 3 has been cleaned and thus carbon compounds and oxides have been removed, and that if a dielectric film is formed on the laminated layer surface 3 of the semiconductor laminated structure 1 in the subsequent steps, the quality of the dielectric film can be improved and the adhesiveness of the dielectric film to the laminated layer surface 3 can be improved. Effects of the dielectric film formed can thus be sufficiently demonstrated.

The laminated layer surface 3 demonstrating the hydrophilic property specifically means that a contact angle θ of the water 6 on the laminated layer surface 3 with respect to the laminated layer surface 3 is equal to or smaller than 60 degrees. On the contrary, if the laminated layer surface 3 does not have a hydrophilic property, that is, if the laminated layer surface 3 has a hydrophobic property, the contact angle θ becomes equal to or larger than 90 degrees (θ becomes 60 to 90 degrees if it has an intermediate property between a hydrophilic property and a hydrophobic property). The contact angle θ may be measured by using a goniometer contact-angle measuring apparatus or the like. It is also possible to approximately distinguish by visual observation whether the contact angle is equal to or smaller than 60 degrees, or within the range of 60 to 90 degrees, or equal to or greater than 90 degrees and thus an approximate surface state may be ascertained by visually confirming the contact angle of water on the laminated layer surface in a treatment process.

As described above, in performing the surface treatment on the laminated layer surface 3 of the semiconductor laminated structure 1, preferably, the surface treatment is performed using an acidic liquid. This is because if the laminated layer surface 3 of the semiconductor laminated structure 1 comes in contact with the atmosphere and is oxidized after the semiconductor laminated structure 1 is formed as depicted in FIG. 1(*a*), by performing the surface treatment on the laminated layer surface 3 using the acidic liquid, contamination such as a residue of an oxide formed on the surface or a carbon compound adhered to the surface due to a surface processing can be effectively removed to clean the laminated layer surface 3.

After the surface treatment is performed on the laminated layer surface 3, as depicted in FIG. 1(*b*), for example a dielectric film 4 is formed at a predetermined position of at least a part of the laminated layer surface 3 of the semiconductor laminated structure 1 (ST3 in FIG. 2). The dielectric film 4 is formed on the laminated layer surface 3 of the semiconductor laminated structure 1 to make the dielectric film 4 to have an effect of promoting a change in a crystalline state in at least a partial region in at least one layer of the semiconductor layers 2-1 and 2-2 to 2-*n* that constitute the semiconductor laminated structure 1 corresponding to a region of the laminated layer surface 3 on which the dielectric film 4 has been formed by the heat treatment described below.

Promoting the effect of changing the crystalline state of the semiconductor layer means to promote movement of constituent atoms of the semiconductor layers 2-1 and 2-2 to 2-*n* that constitute the semiconductor laminated structure 1 due to the thermal actions by the heat treatment or movement of holes corresponding to the moved atoms, for example. More specifically, if the dielectric film 4 has the effect of absorbing the moving constituent atoms of the semiconductor layers 2-1 and 2-2 to 2-*n* or the moving holes, the effect of changing the crystalline state of the semiconductor layer is promoted.

As depicted in FIG. 1(*b*), another dielectric film 4' different from the dielectric film 4 may be formed on the laminated layer surface 3 in a region other than the region where the dielectric film 4 has been formed. The dielectric film 4' is formed on the laminated layer surface 3 of the semiconductor laminated structure 1 to protect the laminated layer surface 3 during the heat treatment explained below and let the dielectric film 4' have an effect of reducing the change in the crystalline state of the semiconductor laminated structure 1 in a region 5*b* in FIG. 1(*c*).

Next, the heat treatment is performed on the semiconductor laminated structure 1 having the dielectric film 4 formed at the predetermined position on the laminated layer surface 3 (ST4 in FIG. 2). The heat treatment is performed to change the crystalline state of the at least the partial region in the at least one layer of the semiconductor laminated structure 1 in a region (a region 5*a* in FIG. 1(*c*)) on which the dielectric film 4 has been formed at the predetermined position on the laminated layer surface 3, as explained in the next paragraph.

When the thermal treatment is performed on the semiconductor laminated structure 1, if the dielectric film 4 has the function of promoting the change in the crystalline state of the semiconductor layer, the crystalline state changes in the at least the partial region in the at least one layer of the semiconductor laminated structure 1 in the region (the region 5*a* in FIG. 1(*c*)) where the dielectric film 4 has been formed, as depicted in FIG. 1(*c*). On the contrary, change in the crystalline state is small in the region (the region 5*b* in FIG. 1(*c*)) where the dielectric film 4' has been formed.

FIG. 1(*c*) is an example of a case in which the crystalline states changed in all of the semiconductor layers 2-1 and 2-2 to 2-*n* of the semiconductor laminated structure 1 in the region (the region 5*a* in FIG. 1(*c*)) on which the dielectric film 4 has been formed. However, the crystalline state/states of which one/ones of the semiconductor layers 2-1 and 2-2 to 2-*n* of the semiconductor laminated structure 1 in the region on which the dielectric film 4 has been formed changes/change greatly depends/depend on semiconductor materials that constitute the semiconductor layers 2-1 and 2-2 to 2-*n*. For example, if a difference between bond energies of the constituent atoms of the semiconductor materials of mutually adjacent semiconductor layers 2-1 and 2-2 to 2-*n* is large, the crystalline states of the semiconductor layers easily change.

After the heat treatment is finished, other necessary treatments are performed on the semiconductor laminated structure 1 (ST5 in FIG. 2) to complete the optical device. The other necessary treatments include adding a structure other than the semiconductor laminated structure 1 that constitutes the optical device and/or performing a treatment different from the surface treatment or heat treatment performed on the semiconductor laminated structure 1, to manufacture a completed body of the optical device.

For example, if the optical device is a light emitting device or a light receiving device, these treatments include etching of physically processing the semiconductor laminated structure 1, forming a passivation film, forming an electrode, and forming a reflection film, to complete the light emitting device or the light receiving device. If the optical device is an optical waveguide, an optical switch, an isolator, or a photonic crystal, these treatments include etching of physically processing the semiconductor laminated structure 1, forming a passivation film, and forming a necessary electrode, to complete the optical waveguide, the optical switch, the isolator, or the photonic crystal.

Examples

Figure 4:
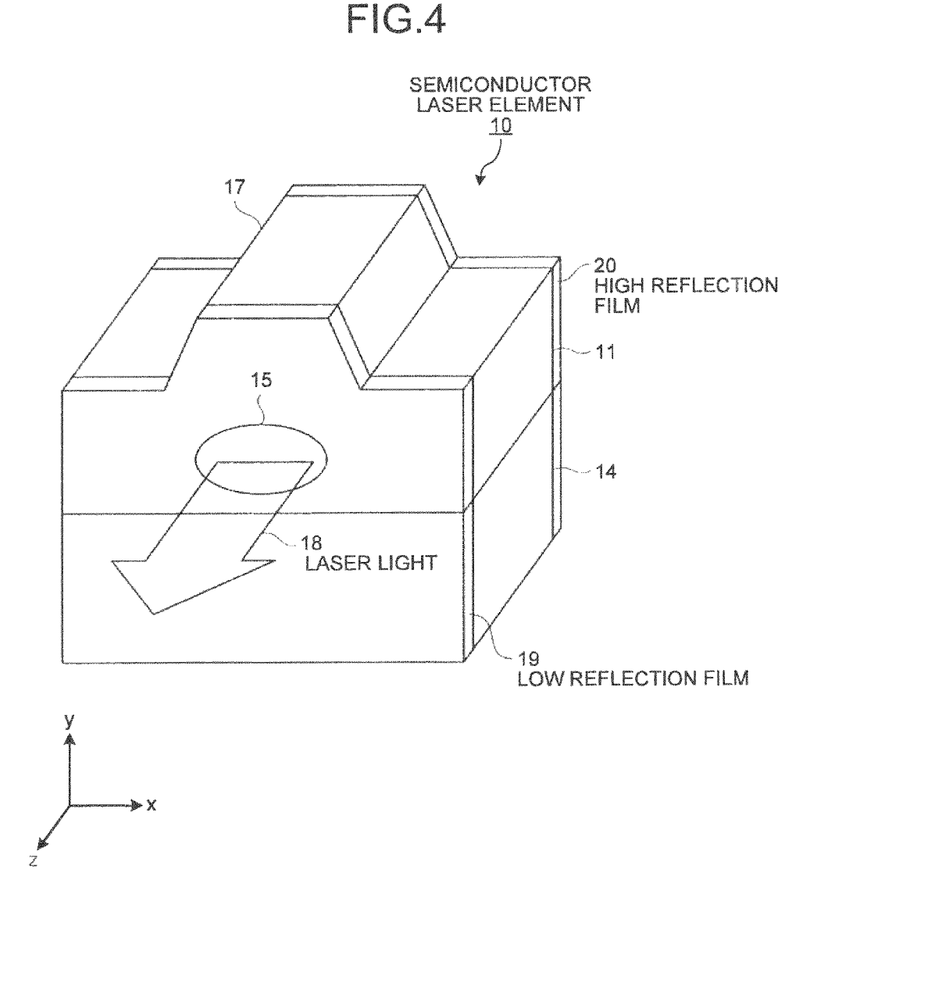
FIG. 4 is a perspective view of a semiconductor laser element manufactured by the manufacturing method of an optical device according to the embodiment of the present invention.

The manufacturing method of an optical device according to an embodiment of the present invention is explained below by exemplifying a more specific manufacturing method of an optical device. FIG. 4 is a perspective view of a semiconductor laser element as a specific example of an optical device manufactured by the manufacturing method of an optical device according to the embodiment of the present invention. A semiconductor laser element 10 depicted in FIG. 4 is subjected to a predetermined physical processing to form a shape of a ridge 17, and has a basic structure having a semiconductor laminated structure 11 formed on a GaAs semiconductor substrate 14, laminated with a plurality of GaAs semiconductor layers, and including an active layer.

The semiconductor laser element 10 further includes two cleavage surfaces at both ends in a longitudinal direction of the ridge 17, by the semiconductor substrate 14 integrated with the semiconductor laminated structure 11 being cleaved. On one of the two cleavage surfaces, a low reflection film 19 is formed to output laser light 18, generated by resonating light generated within the active layer in the semiconductor laminated structure 1 by using the two cleavage surfaces as reflection mirrors, from an emission region 15 of the semiconductor laser element 10 to the outside. On the other cleavage surface, a high reflection film 20 is formed to efficiently output the generated laser light 18 to the outside of the semiconductor laser element 10 from only a low-reflection film 19 end.

Figure 5A:
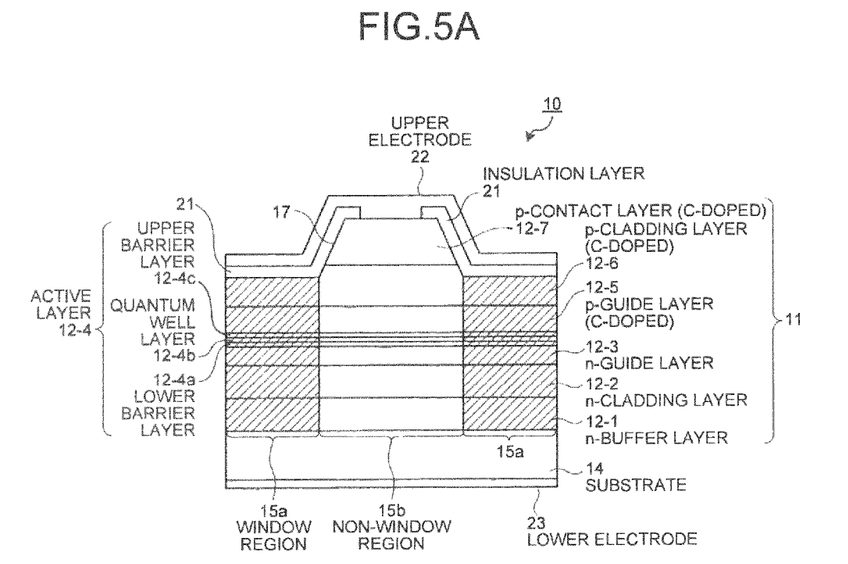
FIG. 5 is cross-sectional views of the semiconductor laser element depicted in FIG. 4, in directions perpendicular to a z-axis and an x-axis, respectively.
Figure 5B:
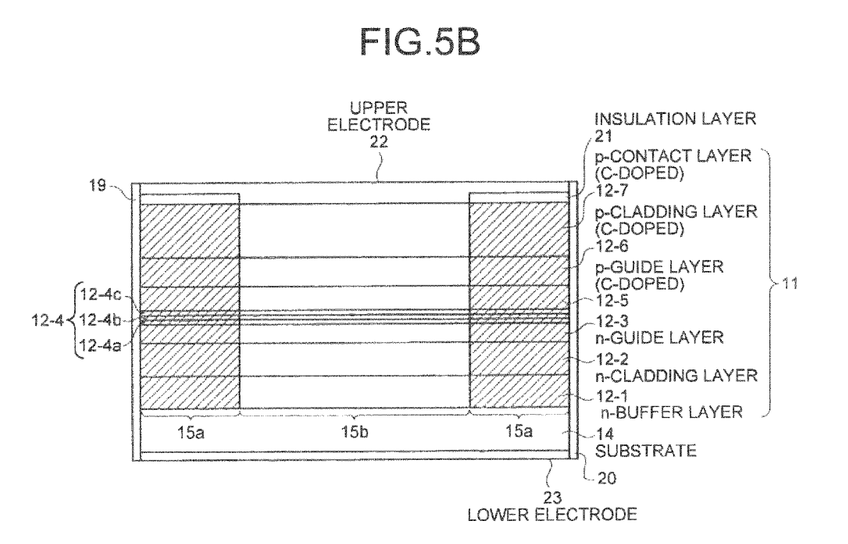

FIG. 5(a) is a cross-sectional view of a plane perpendicular to a z-axis (a light emission direction) in FIG. 4 for specifically explaining a structure of the semiconductor laser element 10 depicted in FIG. 4. FIG. 5(b) is a cross-sectional view of a surface (a surface including a resonator of the semiconductor laser element) that passes a ridge 17 portion and that is a plane perpendicular to an x-axis in FIG. 4. The semiconductor laser element 10 includes in its structure the semiconductor laminated structure 11 formed on the GaAs semiconductor substrate 14 having a thickness of about 100 micrometers. The semiconductor laminated structure 11 is constituted of a plurality of kinds of semiconductor layers that include, in the order from a lower layer, an n-buffer layer 12-1 made of GaAs and having a thickness of about 100 nanometers, an n-cladding layer 12-2 made of AlGaAs (with an Al composition of 40%) and having a thickness of about 2 micrometers, an n-guide layer 12-3 made of AlGaAs (with an Al composition of 30%) and having a thickness of about 400 nanometers, an active layer 12-4, a p-guide layer 12-5 made of AlGaAs (with an Al composition of 30%) and having a thickness of about 400 nanometers, a p-cladding layer 12-6 made of AlGaAs (with an Al composition of 50%) and having a thickness of about 1 micrometer, and a p-contact layer 12-7 made of GaAs, having a thickness of about 500 nanometers, and doped with a high concentration to make contact with an electrode.

The active layer 12-4 forms a quantum well structure constituted of a lower barrier layer 12-4a made of AlGaAs (with an Al composition of 30%), a quantum well layer 12-4b made of InGaAs, and an upper barrier layer 12-4c made of AlGaAs (with an Al composition of 30%), in the order from the lower layer. The quantum well structure may not only be a single-quantum well structure, but instead may be a multi-quantum well structure.

In the semiconductor laser element 10, the ridge 17 is formed by physically processing a part of an upper part of the semiconductor laminated structure 11 to limit a region through which a current is flown into the active layer 12-4. That is, a part of the p-cladding layer 12-6 at an upper side of the semiconductor laminated structure 11 and the p-contact layer 12-7 are physically processed to form the processed portion in a shape of the ridge 17.

The semiconductor laser element 10, to flow the current from the outside into the active layer 12-4, an upper electrode 22 is formed at a p-contact layer 12-7 surface side and a lower electrode 23 is formed on a back surface of the GaAs semiconductor substrate 14. The upper electrode 22 is formed via an insulation layer 21, on a surface of the semiconductor laminated structure 11 other than the top of the ridge 17, to be able to flow the current from only the top of the ridge 17 in flowing the current from the outside.

As described above, the current flown from the upper electrode 22 and the lower electrode 23 is concentrated at a part of the active layer 12-4, due to the ridge 17 formed by having a part of the semiconductor laminated structure 11 processed, and the laser light 18 is output to the outside of the semiconductor laser element 10. However, because the laser light 18 emitted from the emission region 15 (see FIG. 4) has a high optical density, a window region 15a made of a semiconductor material absorbing little laser light is provided in a predetermined region including a light-emission facet, and a region other than that is provided as a non-window region 15b, from a viewpoint of preventing the occurrence of COD (see FIG. 5(b)).

In the region 15a that becomes a window region, a group-III atom in the GaAs compound semiconductor layer described above that constitutes the semiconductor laminated structure 11 is diffused, and a state of including a mixed crystal occurs. Consequently, a crystalline state of the semiconductor layer that constitutes the semiconductor laminated structure 11 in the region 15a is changed.

Figure 6A:
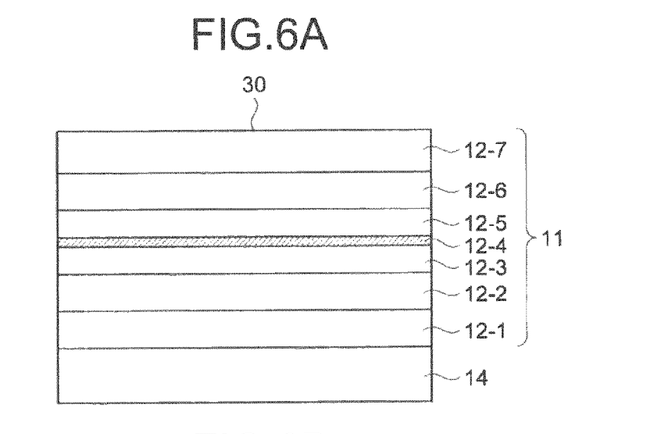
FIG. 6 is cross-sectional views of the semiconductor laser element depicted in FIG. 4, in a direction perpendicular to the z-axis, for illustrating a process of manufacturing the semiconductor laser element depicted in FIG. 4.

A process of manufacturing the semiconductor laser element 10 having the above structure is explained with reference to the drawings. First, as depicted in FIG. 6(a), the semiconductor laminated structure 11 made of the n-buffer layer 12-1, the n-cladding layer 12-2, the n-guide layer 12-3, the active layer 12-4, the p-guide layer 12-5, the p-cladding layer 12-6, and the p-contact layer 12-7 is epitaxially grown on the GaAs semiconductor substrate 14, by using a metal organic chemical vapor deposition (MOCVD) device employing a usually-used MOCVD method.

To provide a predetermined semiconductor layer with conductivity in epitaxially growing the semiconductor laminated structure 11, doping of Si is performed during the epitaxial growth of the n-buffer layer 12-1 and the n-cladding layer 12-2 and doping of C is performed during the epitaxial growth of the p-cladding layer 12-6 and the p-contact layer 12-7.

After the semiconductor laminated structure 11 is epitaxially grown on the semiconductor substrate 14, the semiconductor substrate 14 is taken out from the MOCVD device, and a surface treatment is performed on a laminated layer surface 30 of the semiconductor laminated structure 11. For the surface treatment in the present example, a surface cleaning process was performed for 90 seconds on the laminated layer surface 30 of the semiconductor laminated structure 11 by using an undiluted solution of concentrated sulfuric acid (equal to or greater than 95%) manufactured by Wako Pure Chemical Industries, Ltd. Thereafter, cleaning by deionized water was performed for five minutes.

Figure 7:
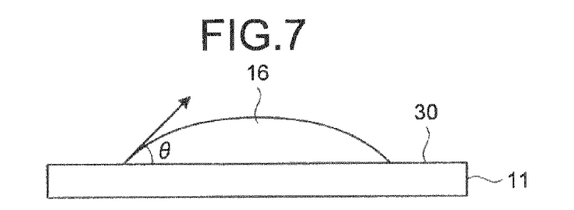
FIG. 7 is a partial cross-sectional view of a semiconductor laminated structure on a substrate for illustrating a process of manufacturing the semiconductor laser element depicted in FIG. 4.

After the surface treatment was performed, a test of dropping water on the laminated layer surface 30 was performed to check a surface state of the laminated layer surface 30 after the surface treatment. As a result of the test, when the surface treatment using the concentrated sulfuric acid was performed, as water 16 was dropped on the laminated layer surface 30, the contact angle θ of the water 16 was about 60 degrees indicating hydrophilicity, as depicted in FIG. 7.

As described above, while a treatment using a concentrated sulfuric acid has been disclosed as a preferable example in the present example, any method that allows reduction of a residual component of a surface carbon compound to a substantially negligible amount may be used as the surface cleaning treatment according to the present invention. For example, a surface treatment may be performed by using a sulfuric acid etchant (sulfuric acid:hydrogen peroxide:water=3:1:50).

Figure 6B:
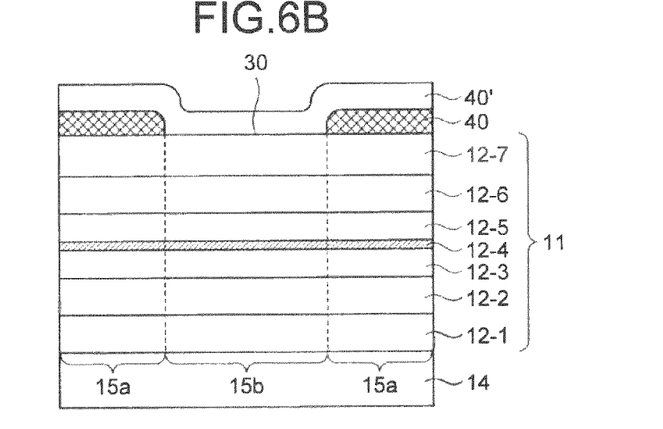

After the test was finished, a dielectric film 40 and a dielectric film 40' which were made of SiN and had refractive indices of 1.9 and 2.1 respectively were formed by using a CVD device on the laminated layer surface 30 corresponding to the regions 15a and the region 15b of the semiconductor laminated structure 11 as depicted in FIG. 6(b). For comparison, samples formed with the dielectric films 40' made of SiN with their refractive indices varied from 2 to 2.2 were also manufactured.

After the dielectric film 40 and the dielectric film 40' are formed on the laminated layer surface 30, a heat treatment is performed on the semiconductor laminated structure 11. In the present example, a device to perform the heat treatment is a rapid thermal annealing (RTA) device. The heat treatment is performed under conditions of the temperature being 900° C. and the treatment time period being 30 seconds.

Figure 6C:
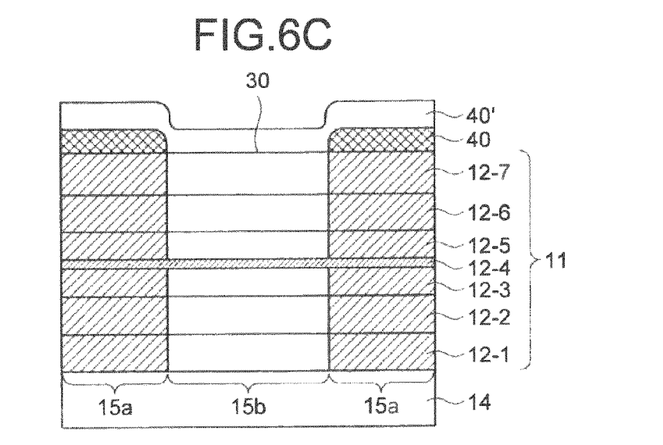

By performing the heat treatment, the crystalline state of at least a partial region in at least one layer of the semiconductor laminated structure 11 in the region 15a in which the dielectric film 40 has been formed changes as depicted in FIG. 6(c). There is little change in the crystalline state in the region 15b in which the dielectric film 40' is formed. In the present example, Ga atoms that constitute the semiconductor layers 12-1 and 12-2 to 12-7 constituting the semiconductor laminated structure 11 by the heat treatment move towards the dielectric film 40, and are absorbed by the dielectric film 40. After the Ga atoms that constitute the semiconductor layers 12-1 and 12-2 to 12-7 move, holes remain, and the crystalline states of the semiconductor layers 12-1 and 12-2 to 12-7 at where the holes remain become a state of including a mixed crystal. In that state, a bandgap of the semiconductor layer increases, and a window region in which laser light emitted from the semiconductor laser element 10 is not absorbed by a layer in which a bandgap has increased is formed. When the heat treatment temperature was as described above, an increase in a bandgap of the semiconductor layer corresponding to the window region was about 70 meV, and increase in a bandgap of the semiconductor layer corresponding to the non-window region was about 10 meV.

Figure 8A:
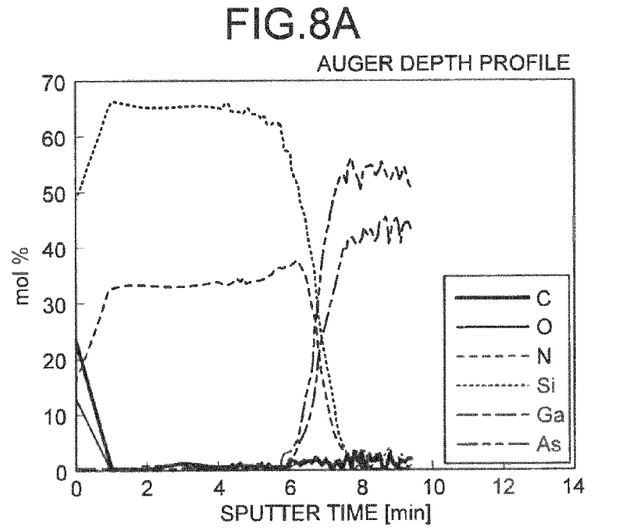
FIG. 8 is diagrams of a surface state by a cleaning method according to the present invention.
Figure 8B:
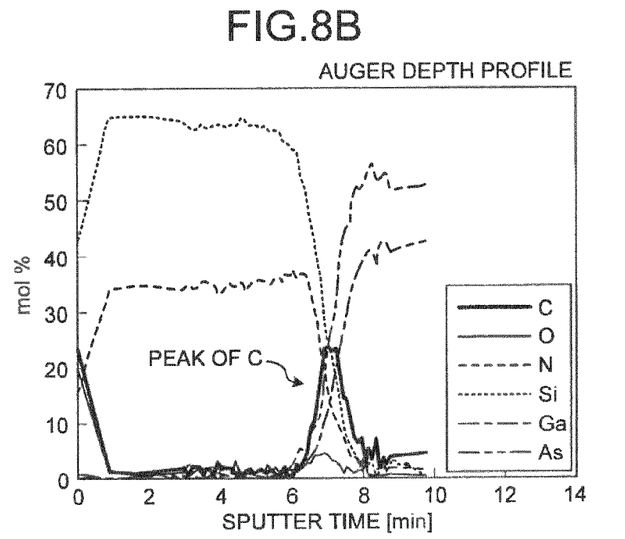
Figure 9A:
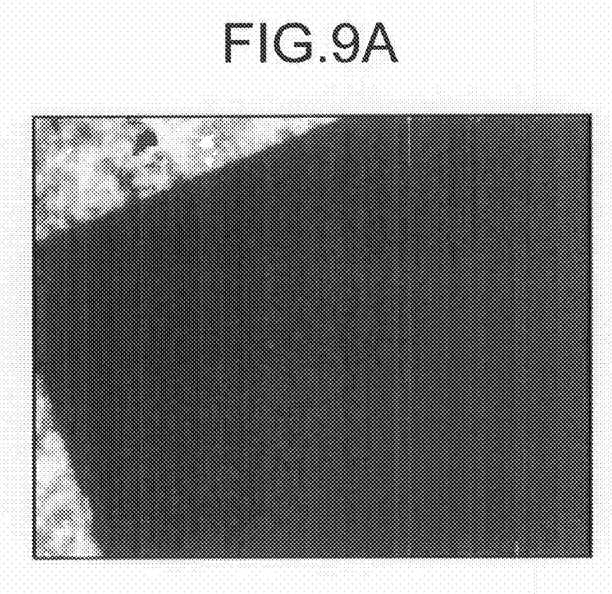
FIG. 9 is diagrams of a surface state of a laminated layer surface in a semiconductor laminated structure after a heat treatment.
Figure 9B:
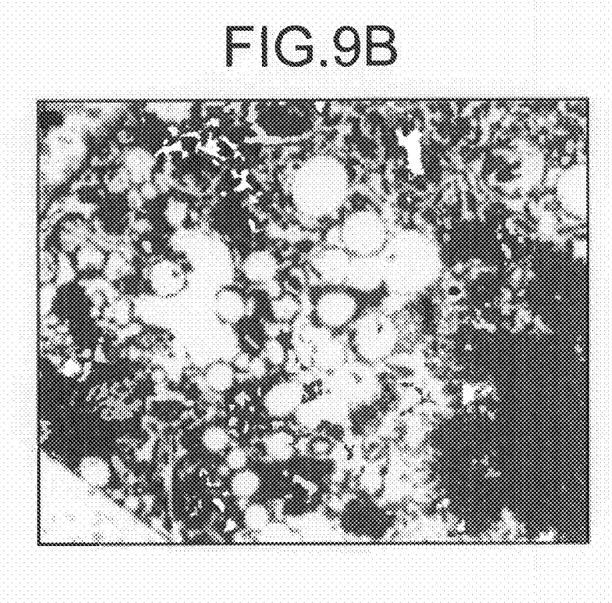

After the heat treatment was performed, a surface state of the laminated layer surface 30 was tested. First, to illustrate comparison with respect to a conventional surface cleaning treatment, results of an Auger analysis of a sample having a dielectric layer deposited on a semiconductor surface cleaned by a cleaning method according to the present invention are depicted in FIG. 8(a), and results of an Auger analysis of a sample having a dielectric layer deposited on a semiconductor surface cleaned by a conventional cleaning method using conventional acetone or hydrochloric acid is depicted in FIG. 8(b). It is understood from the comparison between these figures that according to the cleaning method of the present invention, residual carbon compounds on the surface attributable to the surface processing are prominently reduced to a substantially negligible level. It is also understood that oxides are similarly removed. FIG. 9(a) depicts a surface state of the laminated layer surface 30 after depositing a dielectric film after the surface treatment according to the present invention and performing the heat treatment, and no particular cracks are generated in the dielectric film, the surface state of the laminated layer surface 30 is satisfactory, and the effect of the dielectric film is not reduced. On the contrary, FIG. 9(b) depicts a surface state of the laminated layer surface 30 after depositing a dielectric film after the surface treatment according to the conventional cleaning method and performing the heat treatment, and cracks are generated in the dielectric film, the dielectric film is peeled off from the laminated layer surface 30, and thus the effect of the dielectric film is reduced. FIG. 9(a) and FIG. 9(b) correspond to FIG. 8(a) and FIG. 8(b), respectively, and it can be understood that the presence of residual carbon compounds after the surface cleaning influences greatly a subsequent state of the dielectric layer.

Figure 10:
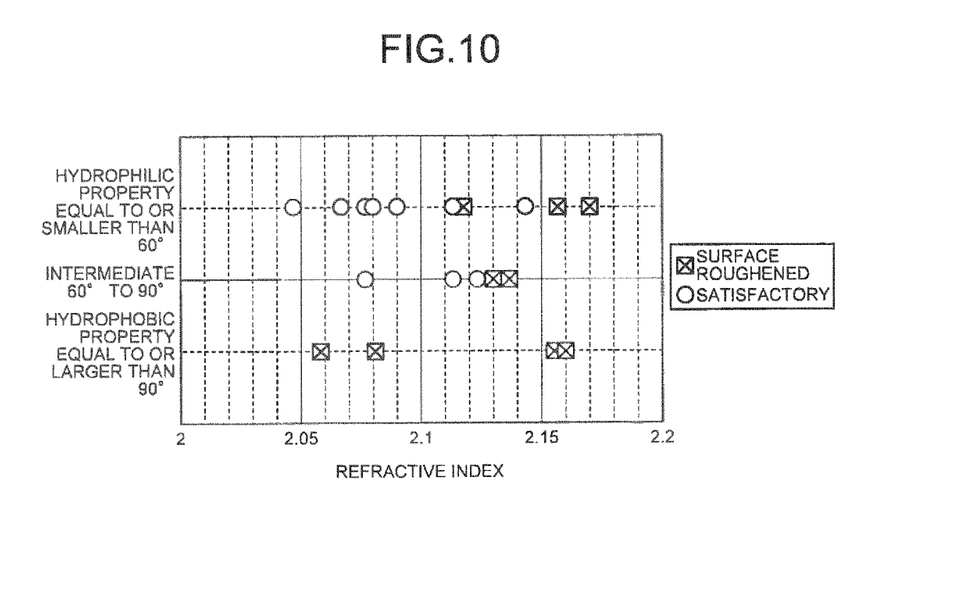
FIG. 10 is a diagram depicting a relationship of presence of roughness in a laminated layer surface after a heat treatment with respect to a refractive index of a dielectric film formed on a laminated layer surface of a semiconductor laminated structure and an affinity on the laminated layer surface of the semiconductor laminated structure to water.

Further, surface states of the laminated layer surfaces 30 after the heat treatments were tested for the samples having the dielectric films 40' made of SiN with their refractive indices varied between 2 and 2.2 formed on the laminated layer surfaces 30, which were manufactured by changing the depositing conditions for comparison. FIG. 10 depicts results of the test.

FIG. 10 depicts a relationship of the presence of surface roughening of the laminated layer surfaces 30 after the heat treatments (peeling off of the dielectric film depicted in FIG. 9) with respect to refractive indices of the dielectric films 40' formed on the laminated layer surfaces 30 and affinities of the semiconductor laminated structures 1 to water on the laminated layer surfaces 30. As can be understood from FIG. 10, when the laminated layer surface 30 after the surface treatment demonstrates hydrophilicity and a refractive index of SiN that constitutes the dielectric film formed on the laminated layer surface 30 is equal to or smaller than 2.1, surface roughening does not occur. That is, when these conditions are satisfied, the effect of the dielectric film is not reduced in the heat treatment, and it is possible to perform the heat treatment appropriately.

FIG. 10 depicts a relationship when the semiconductor layer 12 that constitutes the semiconductor laminated structure 11 is of a GaAs type and the dielectric film formed on the laminated layer surface 30 of the semiconductor laminated structure 11 is SiN. However, even if the semiconductor layer 12 is not of the GaAs type and the dielectric film is not SiN, if the refractive index of the dielectric film is equal to or less than a predetermined value, surface roughening does not occur on the laminated layer surface 30 as long as the laminated layer surface 30 after the surface treatment demonstrates hydrophilicity, and it may be considered that the heat treatment is performed appropriately.

That is, a surface state after the surface treatment relates to adhesiveness between the laminated layer surface 30 of the semiconductor laminated structure 11 and the dielectric film, and a refractive index of the dielectric film relates to a density of a dielectric substance that constitutes the dielectric film. The density of the dielectric substance relates to a stress given to the laminated layer surface 30 on which the dielectric film is formed. Therefore, if the refractive index of the dielectric film is equal to or less than a predetermined value corresponding to a surface state of the laminated layer surface 30, upon formation of the dielectric film on the laminated layer surface 30 of the semiconductor laminated structure 11, a stress working between the dielectric film and the semiconductor layer in the laminated layer surface 30 becomes optimum. Consequently, surface roughening does not occur after the heat treatment. In other words, not being limited to the above described materials, a relationship similar to that depicted in FIG. 10 is established between a surface state of a semiconductor layer and a refractive index of a dielectric layer, regarding the semiconductor layer and the dielectric layer deposited on the semiconductor layer. By setting a surface state of the laminated layer surface 30 and a refractive index of the dielectric layer to conditions of ranges in which the dielectric film after heat treatment becomes satisfactory, it is possible to improve the adhesiveness between the semiconductor layer and the dielectric layer, and to form a dielectric film that is not peeled off after the heat treatment.

Figure 11:
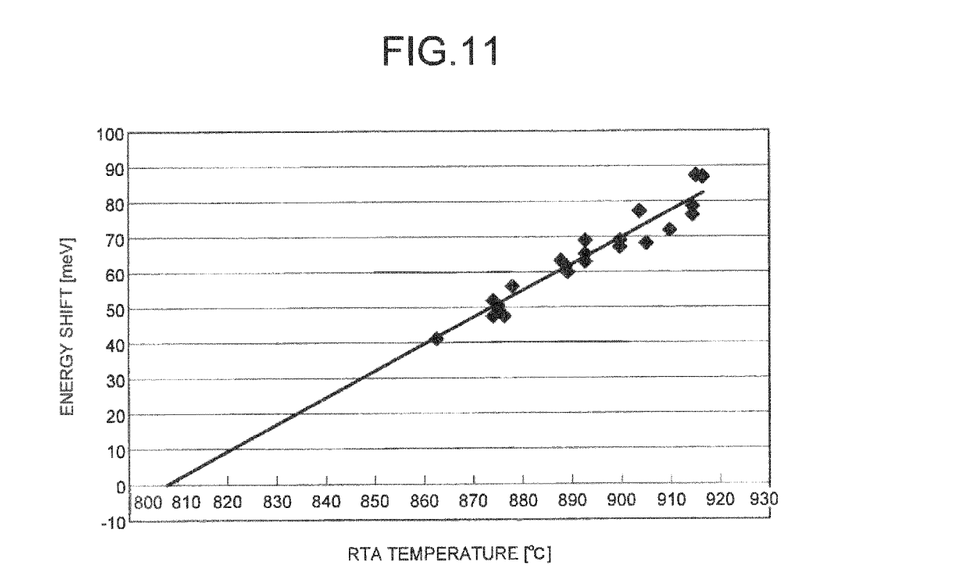
FIG. 11 is a graph of a relationship between a heat treatment temperature and increase in a bandgap of a semiconductor layer corresponding to a window region.

In the present example, the heat treatment temperature was 900° C. Samples subjected to heat treatments at different temperatures were also manufactured, and increases in bandgaps of semiconductor layers corresponding to window regions were measured. FIG. 11 is a graph representing a relationship between a heat treatment temperature and an increase in a bandgap of a semiconductor layer corresponding to a window region. As can be understood from FIG. 11, when the heat treatment temperature is equal to or higher than 800° C., the crystalline states of the semiconductor layers 12-1 and 12-2 to 12-7 are in a state of including a mixed crystal (a bandgap of the semiconductor layer corresponding to the window region increases).

Figure 12A:
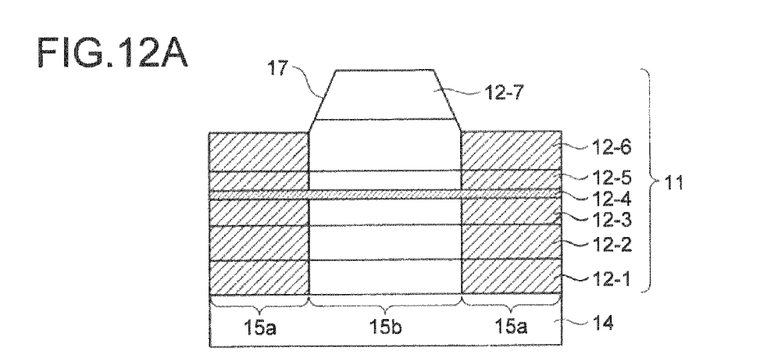
FIG. 12 is partial cross-sectional views of a semiconductor laminated structure on a semiconductor substrate, in a direction perpendicular to the z-axis of the semiconductor laser element depicted in FIG. 4, for illustrating another process of manufacturing the semiconductor laser element depicted in FIG. 4.

After the heat treatment was finished, other necessary processes to complete the semiconductor laser element 10 were performed. A position corresponding to the top of the ridge 17 on the laminated layer surface 30 of the semiconductor laminated structure 11 is masked by performing lithography. After the masking, as depicted in FIG. 12(a), the p-contact layer 12-7 other than the masked portion and an upper part of the p-cladding layer 12-6 are removed by etching, thereby forming the ridge 17.

Figure 12B:
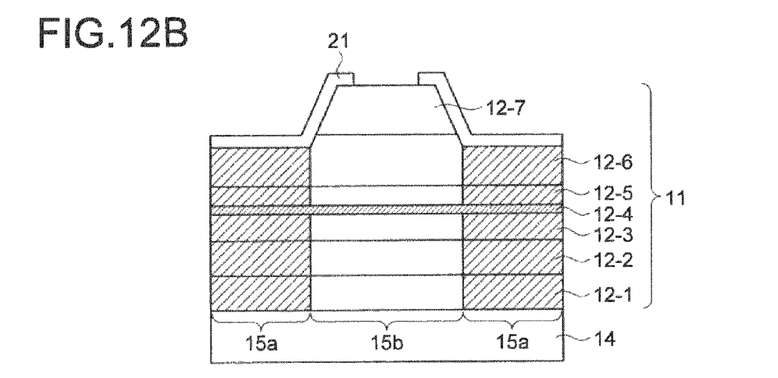

After the ridge 17 is formed, the insulation layer 21 made of SiN is formed by using a CVD device on an exposed surface of the semiconductor laminated structure 11. As depicted in FIG. 12(b), the insulation layer 21 at a position where the upper electrode 22 (see FIG. 5(a)) is to contact is removed. After the upper electrode 22 is formed, a back surface of the semiconductor substrate 14 is polished until its thickness becomes about 100 micrometers, and the lower electrode 23 is formed on the polished surface. The semiconductor substrate 14 is taken into an annealing device, and the formed electrode is sintered. After the sintering is finished, the semiconductor substrate 14 is cleaved bar-shaped, and the low reflection film 19 made of a dielectric multilayer film is formed on one of the cleavage surfaces, and the high reflection film 20 made of a dielectric multilayer film is formed on the other cleavage surface. Finally, the bar-shaped semiconductor substrate 14 is cut into each semiconductor laser element 10, thereby completing the semiconductor laser element 10. The semiconductor laser element according to the present invention is applicable to a communication apparatus using a currently-popularized semiconductor laser.

Figure 13:
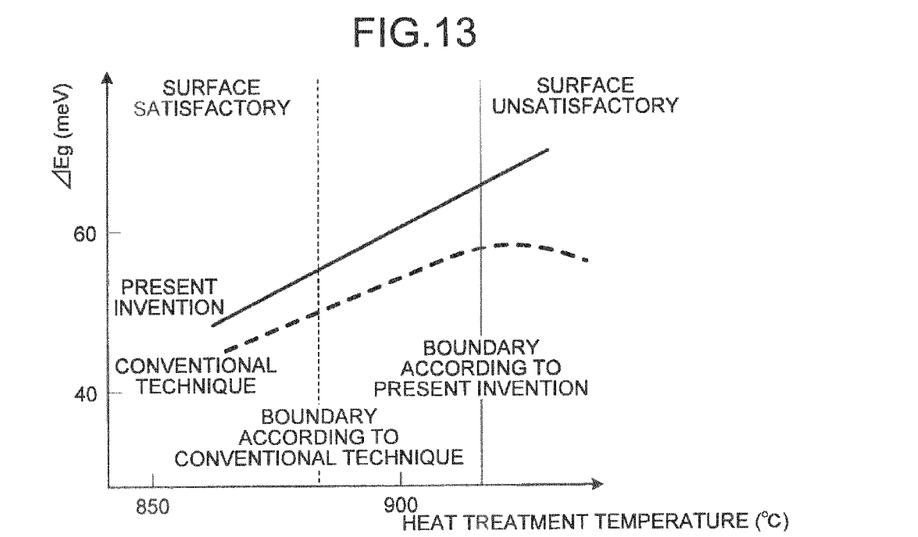
FIG. 13 is a diagram depicting a relationship between an increase in a bandgap due to disordering and a heat treatment temperature according to the present invention.

Finally, FIG. 13 depicts a relationship between a bandgap difference ($\Delta Eg$, a difference between bandgaps of a window region and a non-window region of an active layer) due to disordering of a semiconductor laminated structure having a GaAs active layer according to the present invention and a heat treatment temperature. According to the present invention, $\Delta Eg$ higher than that of a conventional technique can be achieved at the same temperature. Because a temperature at a boundary where occurrence of surface roughening is revealed is higher than that of the conventional technique, a heat treatment can be performed at a temperature higher than that of the conventional technique. As a result, a window region having a large bandgap can be manufactured. At a heat treatment temperature of about 900° C., an increase in a bandgap of the window region becomes equal to or larger than 70 meV, an increase in a bandgap of the non-window region becomes equal to or smaller than 10 meV, and a window having $\Delta Eg > 50$ meV, which has been conventionally difficult to manufacture without surface roughening, can be manufactured.

As explained above, according to the present invention, prominent effects are obtained, such that adhesiveness between a semiconductor layer and a dielectric layer is improved, surface roughening (peeling off) of the dielectric film does not occur, effects of the dielectric layer (promotion of disordering in a window region and suppression of disordering in a non-window region) are sufficiently demonstrated, and a contact resistance is not increased.

According to an embodiment of the present invention, prominent effects of being able to perform a process including a heat treatment appropriately and effects of a dielectric film used not being degraded are demonstrated.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of manufacturing a semiconductor device including a semiconductor layer and a dielectric layer deposited on the semiconductor layer, the method comprising:
    forming the semiconductor layer;
    performing a surface treatment for removing a residual carbon compound, on a surface of the semiconductor layer formed;
    forming a dielectric film following the surface treatment, under a depositing condition corresponding to a surface state after the surface treatment, on at least a part of the surface of the semiconductor layer on which the surface treatment has been performed; and
    changing a crystalline state of at least a partial region of the semiconductor layer by performing a heat treatment on the semiconductor layer on which the dielectric film has been formed.

2. The method according to claim 1, wherein the semiconductor device is an optical device.

3. The method according to claim 1, wherein the semiconductor device is a semiconductor laser.

4. The method according to claim 3, wherein the semiconductor layer is a semiconductor laminated structure formed of a plurality of types of semiconductor layers.

5. The method according to claim 4, wherein the semiconductor laminated structure includes a compound semiconductor layer.

6. The method according to claim 5, wherein the at least a partial region is a window region of an active layer of the semiconductor laser.

7. The method according to claim 6, wherein a temperature of the heat treatment is equal to or higher than a temperature at which a bandgap in the window region increases by becoming an alloy with an adjacent semiconductor layer in the semiconductor laminated structure.

8. The method according to claim 5, wherein the compound semiconductor layer is a GaAs semiconductor layer, and a contact angle between the surface and water is equal to or less than 60 degrees due to the surface treating.

9. The method according to claim 1, wherein the surface treatment is performed by using a sulfuric-acid containing mixture.

10. The method according to claim 1, wherein the dielectric film is deposited under a depositing condition at which its refractive index corresponds to the surface state.

11. The method according to claim 10, wherein the dielectric film is SiN and the refractive index is equal to or less than 2.1.

12. The method according to claim 1, wherein a temperature of the heat treatment is equal to or higher than 800° C.

13. A semiconductor device manufactured by the method according to claim 1.

14. A communication apparatus using the semiconductor device according to claim 13.

* * * * *